United States Patent
Pendharkar et al.

(10) Patent No.: US 10,211,335 B2
(45) Date of Patent: Feb. 19, 2019

(54) LDMOS TRANSISTOR WITH SEGMENTED GATE DIELECTRIC LAYER

(71) Applicant: Texas Instruments Incorporated, Dallas, TX (US)

(72) Inventors: Sameer Pendharkar, Allen, TX (US); Ming-yeh Chuang, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/830,263

(22) Filed: Dec. 4, 2017

(65) Prior Publication Data

US 2018/0175191 A1   Jun. 21, 2018

Related U.S. Application Data

(63) Continuation of application No. 15/385,709, filed on Dec. 20, 2016, now Pat. No. 9,865,729.

(51) Int. Cl.
| | |
|---|---|
| H01L 29/78 | (2006.01) |
| H01L 29/06 | (2006.01) |
| H01L 29/423 | (2006.01) |
| H01L 29/40 | (2006.01) |
| H01L 29/10 | (2006.01) |
| H01L 29/66 | (2006.01) |
| H01L 29/08 | (2006.01) |

(52) U.S. Cl.
CPC ...... *H01L 29/7816* (2013.01); *H01L 29/0696* (2013.01); *H01L 29/408* (2013.01); *H01L 29/42364* (2013.01); *H01L 29/42368* (2013.01); *H01L 29/66681* (2013.01); *H01L 29/0878* (2013.01); *H01L 29/1095* (2013.01); *H01L 29/66689* (2013.01)

(58) Field of Classification Search
None
See application file for complete search history.

(56) References Cited

U.S. PATENT DOCUMENTS

| | | | |
|---|---|---|---|
| 8,592,900 B2 | 11/2013 | Steinmann et al. | |
| 9,865,729 B1 * | 1/2018 | Pendharkar | H01L 29/7816 |
| 2007/0040221 A1 | 2/2007 | Gossner et al. | |
| 2009/0206374 A1 * | 8/2009 | Anderson | H01L 29/66795 257/270 |
| 2013/0307326 A1 | 11/2013 | Fassnacht | |
| 2015/0255596 A1 | 9/2015 | Cai | |
| 2016/0126349 A1 | 5/2016 | Edwards | |
| 2016/0336427 A1 | 11/2016 | Zhang et al. | |

OTHER PUBLICATIONS

John Pritiskutch and Brett Hanson, "Understanding LDMOS Device Fundamentals", AN1226, Application Note, STMicroelectronics, Jul. 2000, pp. 1-4.

* cited by examiner

*Primary Examiner* — Dung Le
(74) *Attorney, Agent, or Firm* — Andrew R. Ralston; Charles A. Brill; Frank D. Cimino

(57) ABSTRACT

A power transistor is provided with at least one transistor finger that lies within a semiconductor material. The gate oxide is segmented into a set of segments with thick field oxide between each segment in order to reduce gate capacitance and thereby improve a resistance times gate charge figure of merit.

17 Claims, 6 Drawing Sheets

LDMOS TRANSISTOR WITH SEGMENTED GATE DIELECTRIC LAYER

CROSS REFERENCE TO RELATED APPLICATIONS

Under 35 U.S.C. § 120, this continuation application claims benefits of and priority to U.S. patent application Ser. No. 15/385,709, filed on Dec. 20, 2016, the entirety of which are hereby incorporated herein by reference.

FIELD OF THE DISCLOSURE

This disclosure relates to power transistors, and in particular to laterally diffused metal oxide semiconductor devices.

BACKGROUND OF THE DISCLOSURE

Power transistors are found in many common electronic devices, including power supplies, voltage converters, integrated circuits, and low-voltage motor controllers. Laterally diffused metal oxide semiconductor (LDMOS) transistors are one type of power transistor and are also used in microwave and radio frequency (RF) power amplifiers, for example. These transistors are often fabricated on p/p+ silicon epitaxial layers.

LDMOS transistors are MOS transistors that also have a drain drift region. The drain drift region, which touches and lies between the drain and the channel region, has the same conductivity type as the drain, but a lower dopant concentration than the drain. A depletion region forms in this lightly doped lateral diffused region resulting in a voltage drop between the drain contact and the transistor gate. With proper design, sufficient voltage may be dropped between the drain contact and the gate dielectric to allow a low gate voltage transistor to be used as a switch for the high voltage.

A large power transistor may be made up of many "fingers," each of which can be long and may be considered to include multiple sub-transistors.

BRIEF DESCRIPTION OF THE DRAWINGS

Particular embodiments in accordance with the disclosure will now be described, by way of example only, and with reference to the accompanying drawings.

Figure 1:
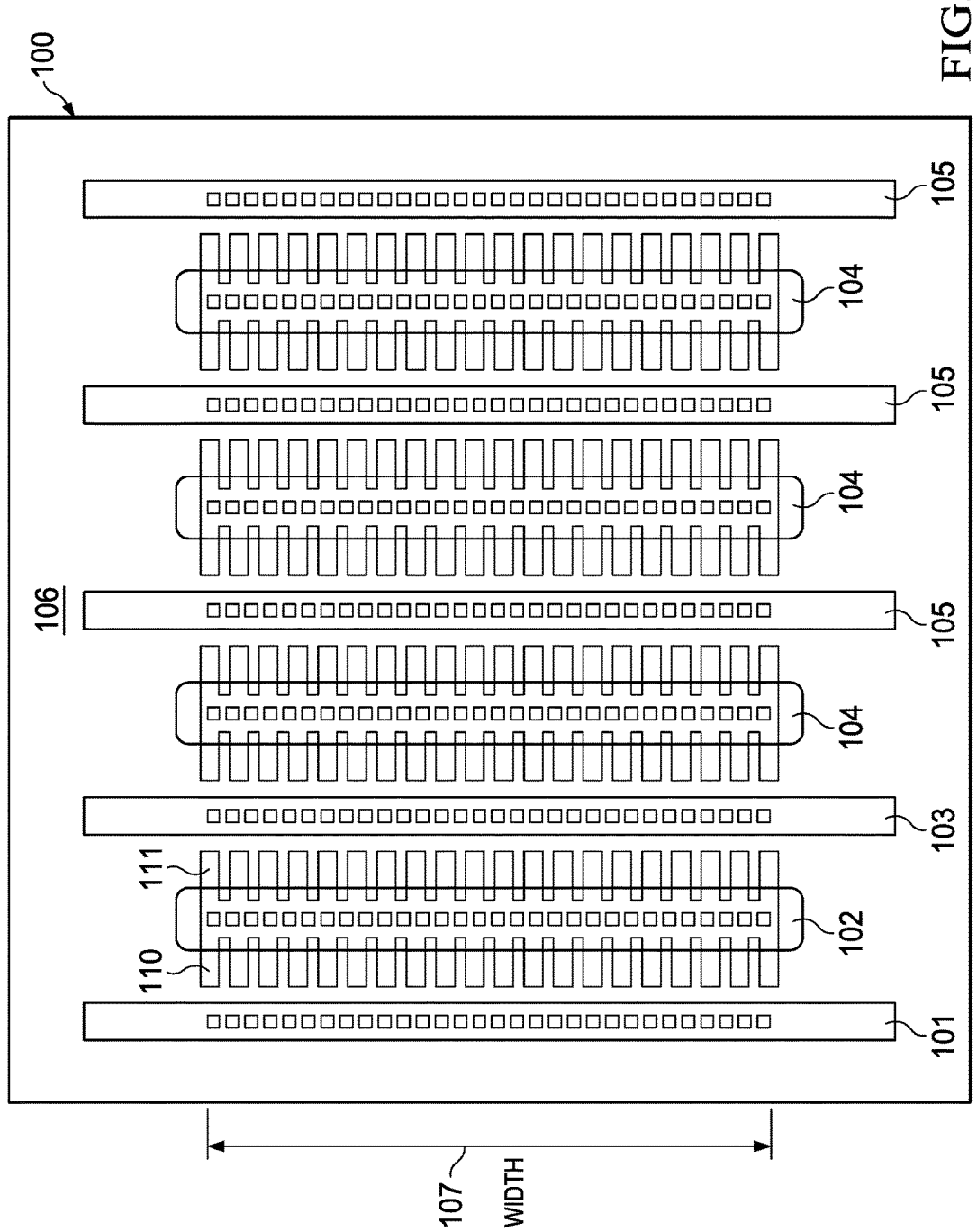
FIG. 1 is a top view of an example multi-finger LDMOS transistor.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure.

In an LDMOS transistor, a lightly doped lateral diffused drain region is constructed between the heavily doped drain contact and the transistor channel region. As the name implies, a lateral current is created between drain and source. A depletion region forms in this lightly doped lateral diffused region resulting in a voltage drop between the drain contact and the transistor gate. With proper design, sufficient voltage may be dropped between the drain contact and the gate dielectric to allow a low gate voltage transistor to be used as a switch for a high voltage load, for example.

A key power device figure of merit (FOM) is RxQg (on resistance times gate charge). RxQg is a dimension-less figure of merit. Typically, RxQg is fixed for a given device technology within a given device technology. Ron is inversely proportional to the channel width, while Qg is directly proportional to channel width. Therefore, to improve RxQg typically requires a technology change which may be time consuming and expensive. A lower RxQg FOM allows a switching device to operate at a higher switching frequency and power efficiency.

A technique disclosed herein provides a layout method that may be used to improve RxQg for a given technology and thus may improve power device performance in a cost efficient manner.

As will be described in more detail below, the gate oxide area of the LDMOS device gate region may be segmented so that the total gate area over thin gate dielectric is reduced. This will reduce the overall gate charge (Qgate, Qg) because the capacitance of the gate is reduced. A side effect is that this also reduces channel width and will therefore increase the drain to source channel resistance (Rdson). However, channel resistance is only a portion of the overall device resistance; the drift region also contributes to Rdson. As such, the reduction in Qg may be more than the increase in Rdson and therefore an overall lower and improved RxQg FOM may result. This solution may help improve RxQg for a given technology with just a simple layout change. No new process development is required to implement this solution.

FIG. 1 is a top view of an example multi-finger LDMOS transistor 100. In this example, metal interconnect layers have been removed in order to more clearly see an aspect of the underlying structure that will be described in more detail below with regard to FIG. 2. Each finger of transistor 100 includes a source region stripe 102 and a substantially parallel drain region stripe 101 that lie within a semiconductor substrate material 106. In this example, a second substantially parallel drain region stripe 103 shares source region stripe 102. In some embodiments, there may be only one finger that may include only one source region stripe 102 and one drain region stripe 101, for example. In other embodiments, there may be only one finger that may include only one source region stripe 102 and two drain region stripes 101, 103, for example. In yet other embodiments, there may be multiple fingers in which additional substantially parallel source region stripes 104 and drain region stripes 105 are included. In the case of multiple source and drain region stripes, conductive interconnects may be used to connect the drain region stripes 101, 103, 105, etc in parallel and to connect the source region stripes 102, 104, etc in parallel to form a single transistor with multiple parallel fingers. The conductive interconnects may be metallic, for example. In other embodiments, the conductive interconnects may be polysilicon, silicide, or other known or later developed conductive interconnect materials. Semiconductor substrate material 106 is typically silicon; however other embodiments of the disclosure may be applied to other semiconductor materials, such as germanium, etc.

A channel region stripe is located substantially parallel to and between each of the source region stripes and the drain region stripes. A comb shaped gate oxide region stripe 110 overlays the channel region stripe between source region 102 and drain region 101. Field oxide is typically formed as a thick region of silicon dioxide, however, other known or later developed dielectrics may be used to form the comb shaped structure 110. In this example, a similar comb shaped gate oxide region stripe 111 overlays the channel region stripe between source region 102 and drain region 103. Similar comb shaped gate oxide regions may be located between each source and drain region of the multiple fingers. Each comb shaped gate oxide region stripe has a plurality of fingers oriented perpendicular to the source region stripe and the drain region stripe.

The general operation of LDMOS devices is well known; see, for example, "Understanding LDMOS Device Fundamentals," John Pritiskutch, et al. The acronym "LDMOS" is a concatenation of acronyms that have been used to designate various aspects of the lateral device and often stands for lateral current (L) double-diffused MOS (DMOS). These devices can be created in two common types, the PMOS (p-type MOSFET) and NMOS (n-type MOSFET).

An LDMOS transistor is a three terminal device (assuming the substrate is shorted to source), commonly identified as the source, gate and drain, where the voltage on the gate controls the current flowing from the drain to the source. The most common circuit configuration for these devices is the common source (CS) configuration, which is comparable (in some respects) to the common emitter configuration of the bipolar transistor. Other configurations may be used, but under the CS configuration the drain is connected to the high DC voltage while the source is grounded. The gate is used to induce a field-enhanced depletion region between the source and drain, and thereby create a "channel." The acronym NMOS was derived from the fact that the p-type channel has been inverted, creating an effective n-type material due to the depletion of the holes in the p-type channel. A high concentration of electrons is left with energy near the conduction band due to the barrier lowering caused by the gate field, and the electrons can then accelerate due to the field produced by the drain to source biasing. The LDMOS channel is predominately defined by the physical size of the gate structure (ignoring secondary effects due to diffusion vagaries) that overlies the graded p-type threshold adjust implantation and diffusion area. The source and drain regions are on the laterally opposing sides of the gate area, and the diffusion process may produce an undercut region below the gate due to the single-step lateral diffusion process that defines the source and drain regions. The source and drain regions under bias create depletion regions that are connected by the gate induced depletion region in the p-body, and this connection defines the "effective channel length" which is a measure of the distance between the source and drain depletion edges. For NMOS, the depletion region is a region where the high electric field lowers the energy barrier to the electron conduction band. Once the barrier is lowered sufficiently, current easily flows between source and drain. LDMOS channel current is controlled by the vertical electric field induced by the gate and the lateral field that exists between the source and drain.

Figure 2:
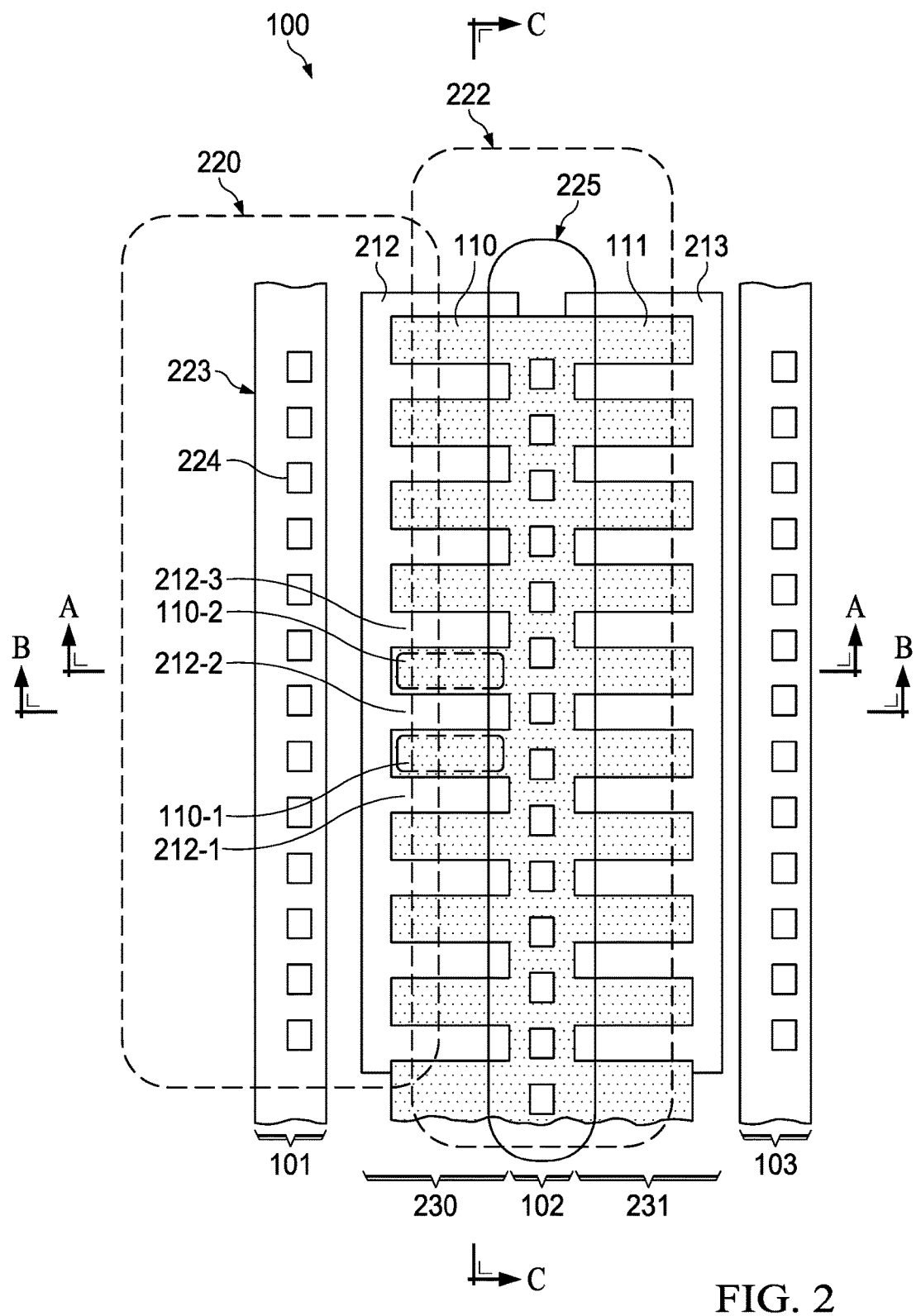
FIG. 2 is a more detailed view of a portion of the LDMOS transistor of FIG. 1.
Figure 3:
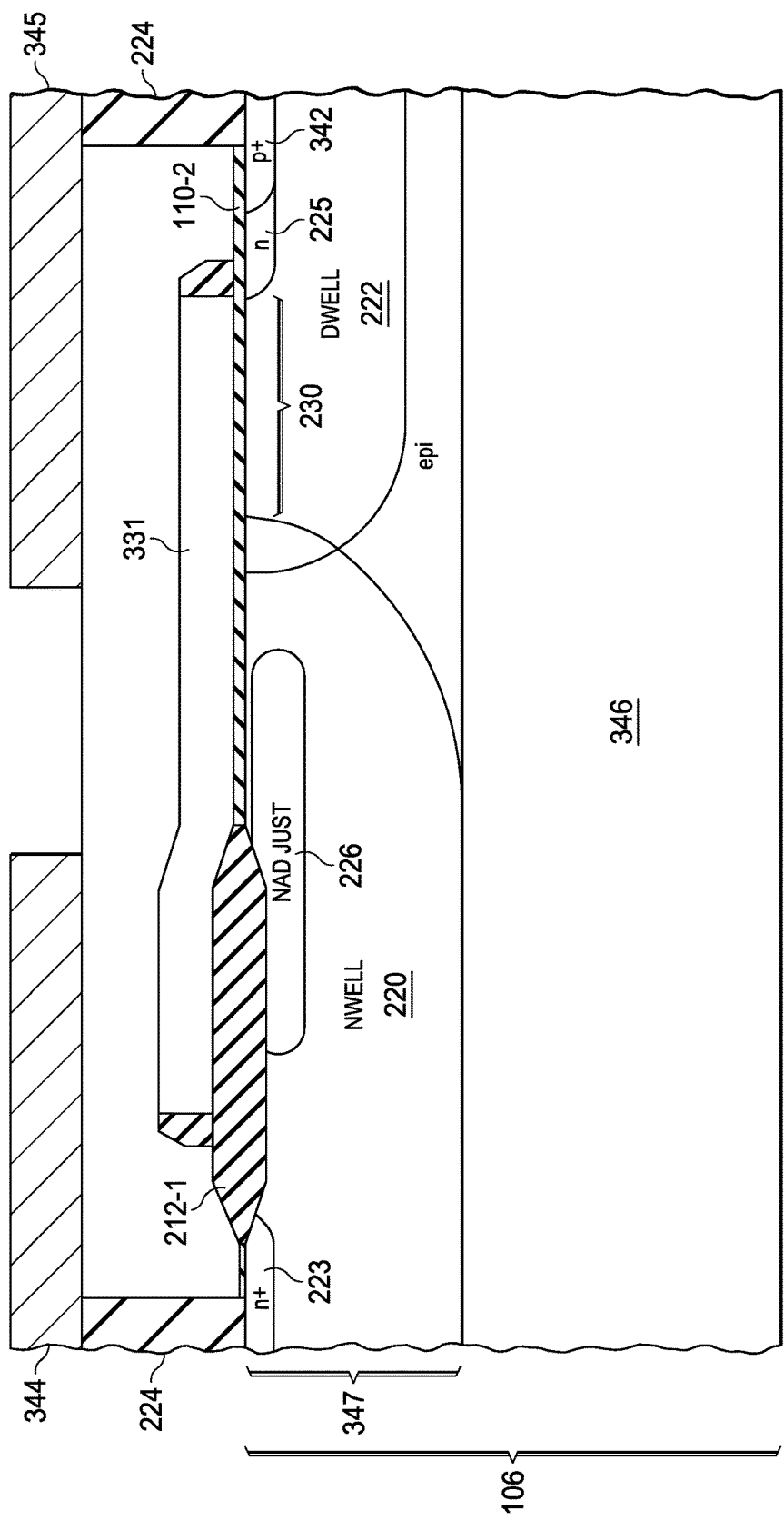
FIGS. 3-5 are cross-sectional views of the LDMOS transistor of FIG. 1.
Figure 4:
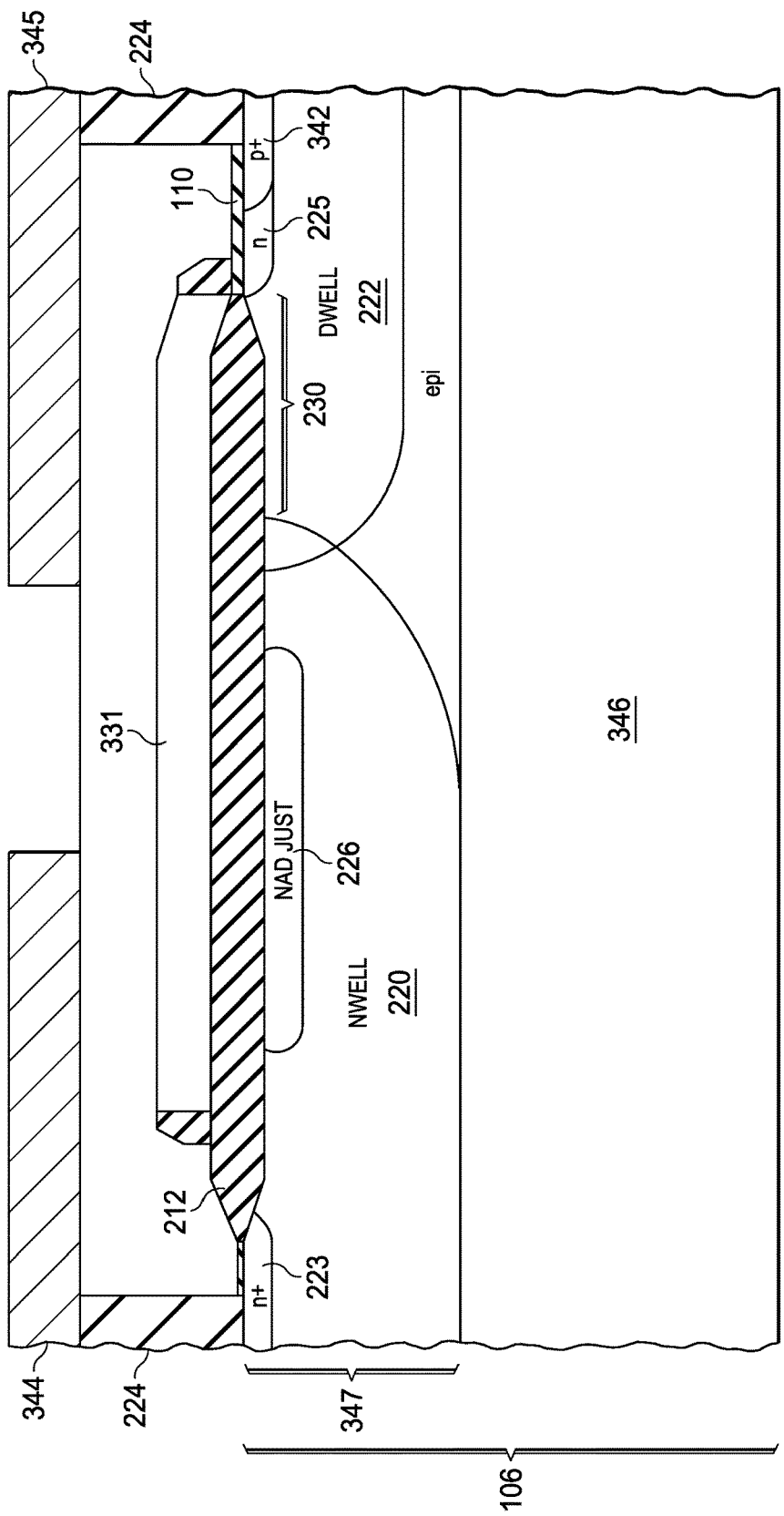
Figure 5:
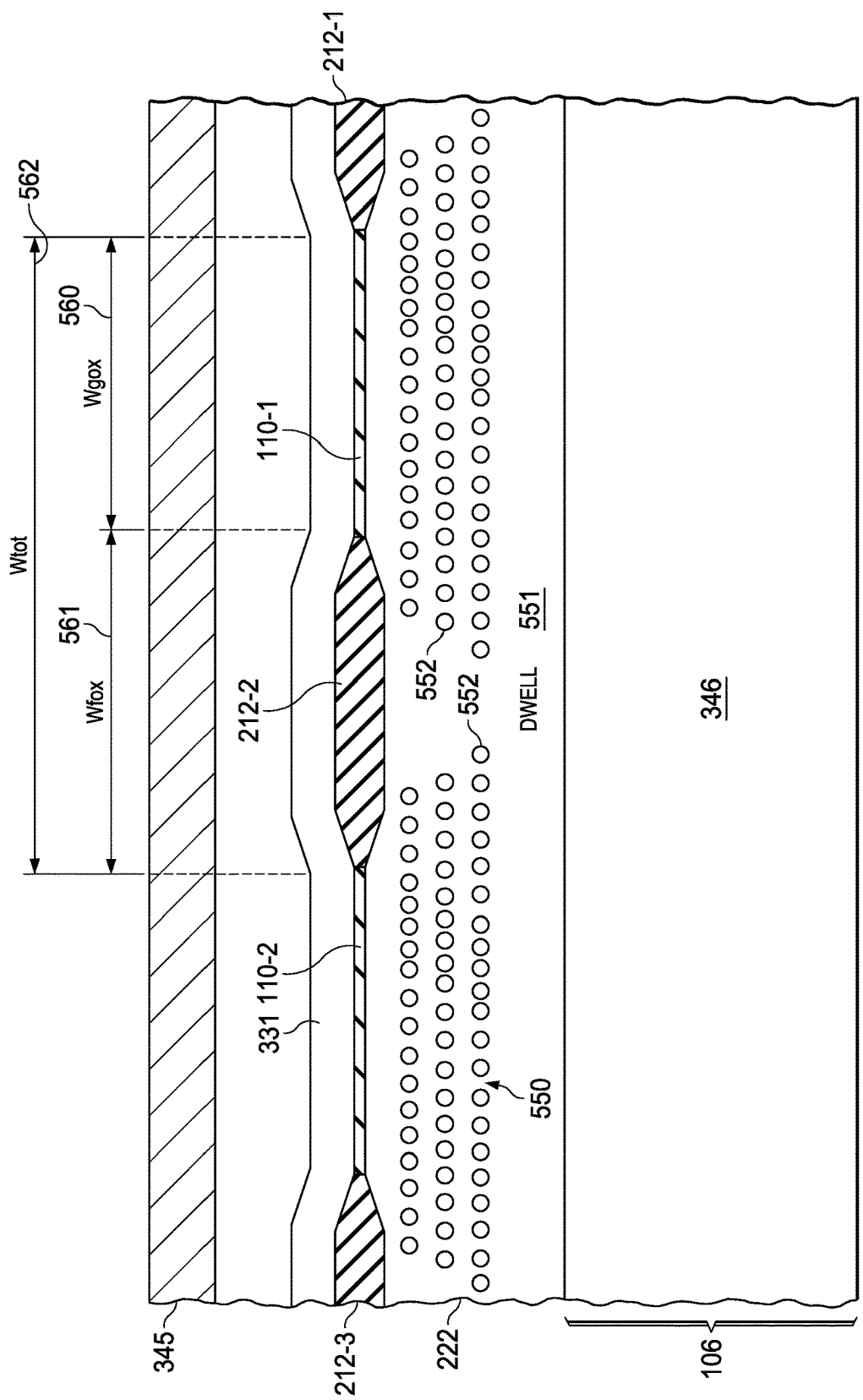

FIG. 2 is a more detailed view of a portion of the LDMOS transistor 100 of FIG. 1. FIG. 3 is a cross-sectional views of LDMOS transistor 100 at cut line A-A, FIG. 4 is a cross-sectional views of LDMOS transistor 100 at cut line B-B, and FIG. 5 is a cross-sectional views of a small portion of LDMOS transistor 100 at cut line C-C. FIGS. 3-5 show only a small portion of LDMOS device 100 between source stripe 102 and drain stripe 101; however, this is representative of the rest of LDMOS 100. For example, the region between source region stripe 102 and drain region stripe 103 is a mirror image of FIGS. 3-4.

Referring still to FIG. 2, drain region 101 includes an n+ region 223 that is diffused into nwell 220. Nwell 220 is diffused into an epitaxial layer 347 of semiconductor substrate 106, as shown in FIG. 3. Epi layer 347 is formed on top of bulk region 346 of substrate 106 using known processing techniques. N+ region 223 contacts a string of vias 224 that provide a connection to a drain conductive interconnect 344 shown in FIG. 3. Nwell 220 forms a lateral drift region with a low doping level to allow operation of LDMOS device 100 at higher voltage levels. Nadjust region 226 is a region of higher doping to promote channel current flow.

Source region 102 includes an n+ region 225 that is diffused into pwell 222. Pwell 222 is diffused into epi layer 347, as shown in FIG. 3. P+ region 342 is also diffused into Pwell 222 and forms a contact region. Pwell 222 may also be referred to as a "double diffused well" (dwell) because the P-type body layer may be formed via implantation through the same opening in the same mask utilized to establish a N-type surface layer (not shown here) of the double diffused well 222. A string of vias 224 connect n+ region source region 225 and p+ contact region 342 to a source conductive interconnect 345.

A channel region stripe 230 is located substantially parallel to and between the source region stripe 102 and the drain region stripe 101 in dwell 222. Similarly, a channel region stripe 231 is located substantially parallel to and between the source region stripe 102 and the drain region stripe 103.

A comb shaped gate oxide region stripe 110 overlays channel region stripe 230. The comb shaped gate oxide region stripe has a plurality of fingers oriented perpendicular to the source region stripe and the drain region stripe. A comb shaped field oxide region 212 has a plurality of fingers that lie between each of the plurality of fingers of the comb shaped gate oxide 110. Similarly, a comb shaped gate oxide region stripe 111 overlays channel region stripe 231. The comb shaped gate oxide region stripe has a plurality of fingers oriented perpendicular to the source region stripe and the drain region stripe. A comb shaped field oxide region 213 has a plurality of fingers that lie between each of the plurality of fingers of the comb shaped gate oxide 111.

In this manner, gate oxide 110 is segmented into a set of essentially separate gate regions or "segments", such as indicated at 110-1, 110-2 in FIG. 2 over the channel region. Between each thin gate segment there is a finger of thick field oxide region 212, such as indicated at 212-1, 212-2, 212-3, etc. Gate oxide 111 is similarly segmented into a set of essentially separate gate regions separated by thick field oxide 213.

A conductive gate layer 331 overlies comb shaped gate oxide 110 and comb shaped field oxide 212, as illustrated in FIG. 3 and FIG. 4. As disclosed above, by segmenting the gate oxide area of the LDMOS device gate region, the total gate area over thin gate dielectric is reduced. This will reduce the overall gate charge (Qgate, Qg) because the capacitance of the gate is reduced. A side effect is that this also reduces channel width and will therefore increase the drain to source channel resistance (Rdson). However, channel resistance is only a portion of the overall device resistance. Furthermore, referring to FIG. 5, the dots in the channel region under gate oxide segments 110-1, 110-2 represent channel current flowing through the channel region from the source region 225 to the drain region 223. Note that in addition to the current flow indicated by dots 550 directly under gate region 110-2, for example, there may be some spillover of current under the field oxide regions 212-2, 212-3, for example, as indicated by dots 551, 552.

Due to the current spillover effect, the reduction in Qg may be more than the increase in Rdson and therefore an overall lower and improved RxQg FOM may result. This solution helps improve RxQg for a given technology with just a simple layout change to the field oxide mask to add the comb like fingers to the field oxide structure in the gate area. No new process development is required to implement this solution. Table 1 illustrates an example improvement in RxQg for this example. Referring to FIG. 5, width 560 is representative of the gate oxide width (Wgox) of each gate oxide segment, such as gate oxide segment 110-1, 110-2, etc. of LDMOS device 100. Width 561 is representative of the field oxide width (Wfox) of each field oxide segment, such as field oxide segment 212-1, 212-2, etc. Width 562 represents the total width (Wtot) of each of the sub-transistors and includes the width of the field oxide segment and the width of the gate oxide segment. In a conventional layout, the ratio (R) of Wgox/Wtot equals one. In the segmented gate oxide layout disclosed herein, R is less than one.

TABLE 1

RxQg improvement example

| Wgox/Wtot ratio (R) | Ron × Qg improvement % |
|---|---|
| 1 (conventional layout) | 0 |
| 0.55 | 15% |
| 0.41 | 25% |
| 0.32 | 35% |

Figure 6:
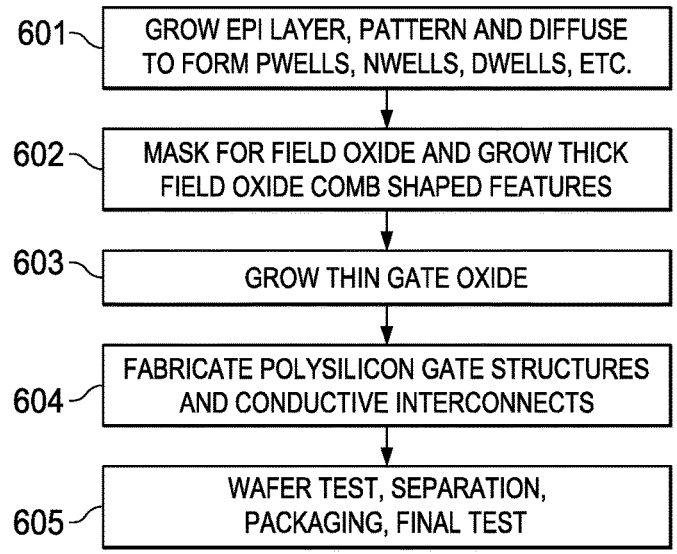
FIG. 6 is a flow chart illustrating a method for forming segmented gate oxide in an LDMOS transistor.

FIG. 6 is a flow chart illustrating a method for forming segmented gate oxide in an LDMOS transistor, such as LDMOS transistor 100 of FIG. 1-5. As mentioned above, the general operation of LDMOS transistors is well known. Similarly, the semiconductor process for fabricating an LDMOS transistor is well known. Therefore, only the key fabrication steps based on this disclosure will be described in detail herein.

Initially, a semiconductor wafer is processed to form an epitaxial layer on top of the semiconductor wafer in step 601. Nwell, pwell, and dwell regions are then patterned and diffused into the epi layer.

A mask is then applied in step 602 to form field oxide regions. As disclosed above, the field oxide is in the gate region is a comb shaped region that has a plurality of fingers oriented perpendicular to the source region stripe and the drain region stripe. An oxidation step is then performed to grow the thick field oxide in the channel regions as illustrated in FIGS. 1-5.

A thin gate oxide layer is then grown over the wafer in step 603. This results in a comb shaped gate oxide stripe in which each finger of the gate oxide comb lies between two fingers of the field oxide comb.

Additional fabrication steps are then performed in step 604 to deposit a polysilicon layer and etch it to form the polysilicon gate structures. Additional diffusions may be performed to form the p+ and n+ drain and source region stripes described in more detail above with regards to FIGS. 3-5, followed by one or more conductive layers that are patterned and etched to form interconnects, etc.

After the semiconductor processing is completed, wafer testing is performed in step 605, followed by a sawing operation to separate the die, packaging, and final testing of the integrated circuit.

System Example

Figure 7:
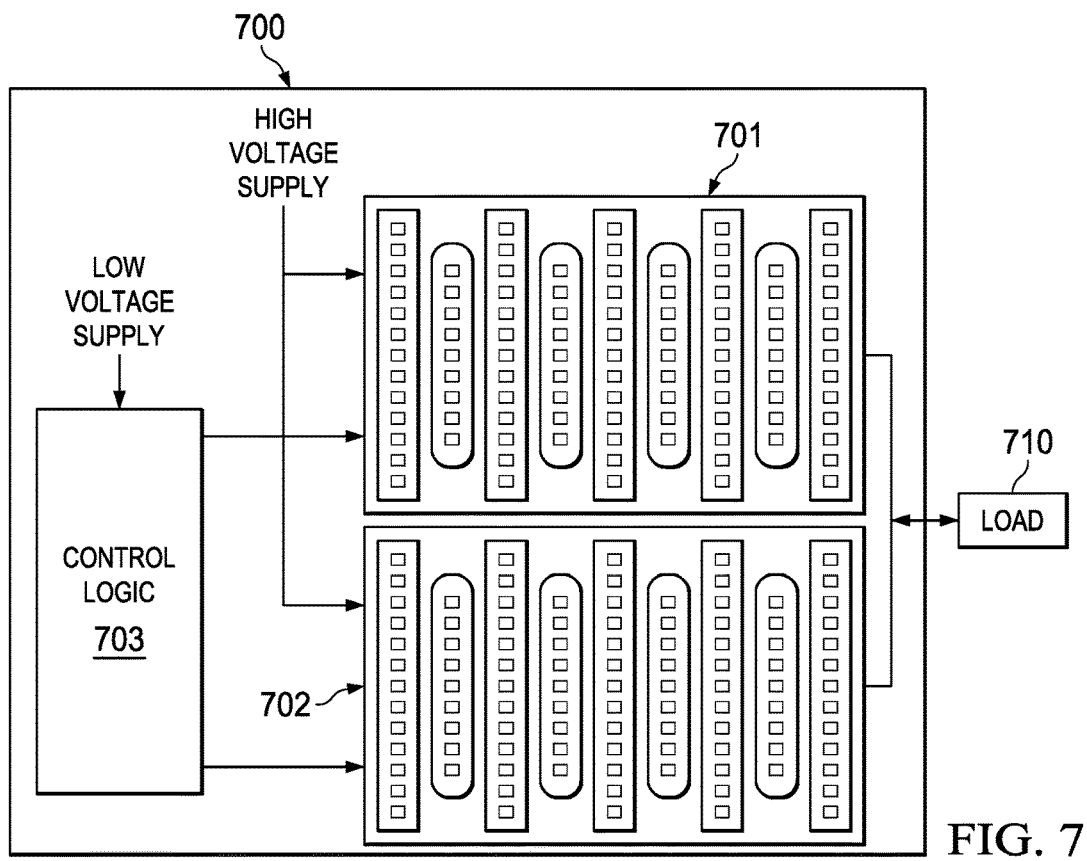
FIG. 7 is a block diagram of an example integrated circuit that includes an LDMOS transistor.

FIG. 7 is a block diagram of an example system with integrated circuit (IC) 700 that includes an LDMOS transistor. In this example, two LDMOS transistors 701, 702 are included, each of which may be similar to the LDMOS transistor described with regard to FIGS. 1-5.

Control logic 703 may also be included within IC 700. Control logic may be tailored to perform a particular control task, or may be implemented as a processor core that may include memory for holding software and firmware instructions that may be executed by the processor to control the operation of LDMOS transistors 701, 702, for example. Additional interface logic, etc may be included within IC 700.

Various types of systems may be implemented by connecting a load such as load device 710 to be powered under control of IC 700. Systems such as microwave and radio frequency (RF) power amplifiers may be implemented for example. Various types of industrial, residential, commercial, medical, etc. systems may be implemented using power transistors that are fabricated using the techniques disclosed herein to control motors, actuators, lights, etc.

Other Embodiments

While the disclosure has been described with reference to illustrative embodiments, this description is not intended to be construed in a limiting sense. Various other embodiments of the disclosure will be apparent to persons skilled in the art upon reference to this description. For example, while a LDMOS device was described herein, other embodiments may include other commonly known or later developed power transistors, such as: horizontal or vertical type double diffused power transistors (DMOS), double diffused drain MOS (DDDMOS) transistors, insulated gate bipolar transistors (IGBT), drain extended MOS (DEMOS) transitors, drain extended complimentary MOS (DE-CMOS) transistors, etc.

In another embodiment, a similar effect may be obtained by using a uniform gate oxide as in a conventional layout, but patterning the polysilicon gate layer to form a comb shaped gate structure, in which the comb shaped gate structure has a plurality of fingers oriented perpendicular to the source region stripe and the drain region stripe. While a multi-finger power transistor was described herein, other embodiments may include a single finger power transistor. In some embodiments, there may only be a single drain stripe and a single source stripe.

While a linear transistor finger was described herein, in some embodiments, the finger topology may be other shapes than linear. For example, each finger may be configured as a circle, a square, a rectangle, u-shaped, etc.

While a comb shaped field oxide feature with field oxide fingers that lie between each of the fingers of the comb shaped gate oxide was described herein, in another embodiment a different type of comb shaped dielectric may be used. For example, a low k dielectric such as an organic polymer may be used. A high k dielectric such as hafnium silicate, zirconium silicate, hafnium dioxide, zirconium dioxide, etc may be used.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A transistor device, comprising:
   a semiconductor substrate having a surface;
   a source region stripe extending into the semiconductor substrate from the surface;
   a drain region stripe extending into the semiconductor substrate from the surface, the drain region stripe spaced apart from and arranged parallel to the source region stripe;
   gate dielectric segments over the source region stripe and extending toward the drain region stripe in a direction perpendicular to the source region stripe, the gate dielectric segments spaced apart from each other by a distance; and
   a body region laterally surrounding the source region stripe, wherein the gate dielectric segments extend above and across the source region stripe and the body region.

2. The transistor device of claim 1, further comprising:
   a channel region between and alongside the source region stripe and the drain region stripe, wherein the gate dielectric segments form an alternating pattern over the channel region.

3. The transistor device of claim 1, further comprising:
   field dielectric segments alternating with the gate dielectric segments along a channel width region in between and parallel to the source region stripe and the drain region stripe, each of the field dielectric segments having a greater dielectric thickness than each of the gate dielectric segments.

4. The transistor device of claim 1, wherein the source region stripe and the drain region stripe each includes an n-type dopant.

5. The transistor device of claim 1, wherein the source region stripe and the drain region stripe each includes a p-type dopant.

6. The transistor device of claim 1, further comprising:
   a drain drift region laterally surrounding the drain region stripe, wherein the gate dielectric segments extend above the drain drift region without reaching the drain region stripe.

7. The transistor device of claim 1, wherein each of the gate dielectric segments has a width oriented parallel to the source region stripe, and the width is approximately equal to the distance between an adjacent pair of the gate dielectric segments.

8. An integrated circuit, comprising:
   a semiconductor substrate having a surface; and
   transistor devices each including:
      a source region stripe extending into the semiconductor substrate from the surface;
      a drain region stripe extending into the semiconductor substrate from the surface, the drain region stripe spaced apart from and arranged parallel to the source region stripe;
      gate dielectric segments over the source region stripe and extending toward the drain region stripe in a direction perpendicular to the source region stripe, the gate dielectric segments spaced apart from each other by a distance; and
      a body region laterally surrounding the source region stripe, wherein the gate dielectric segments extend above and across the source region stripe and the body region.

9. The integrated circuit of claim 8, wherein each of the transistor devices includes:
   a channel region between and alongside the source region stripe and the drain region stripe, wherein the gate dielectric segments form an alternating pattern over the channel region.

10. The integrated circuit of claim 8, wherein each of the transistor devices includes:
    field dielectric segments alternating with the gate dielectric segments along a channel width region in between and parallel to the source region stripe and the drain region stripe, each of the field dielectric segments having a greater dielectric thickness than each of the gate dielectric segments.

11. The integrated circuit of claim 8, wherein the source region stripe and the drain region stripe each includes an n-type dopant.

12. The integrated circuit of claim 8, wherein the source region stripe and the drain region stripe each includes a p-type dopant.

13. The integrated circuit of claim 8, wherein each of the transistor devices includes:
    a drain drift region laterally surrounding the drain region stripe, wherein the gate dielectric segments extend above the drain drift region without reaching the drain region stripe.

14. The integrated circuit of claim 8, wherein each of the gate dielectric segments has a width oriented parallel to the source region stripe, and the width is approximately equal to the distance between an adjacent pair of the gate dielectric segments.

15. A transistor device, comprising:
    a semiconductor substrate having a surface;
    a source region stripe extending into the semiconductor substrate from the surface;

a drain region stripe extending into the semiconductor substrate from the surface, the drain region stripe spaced apart from and arranged parallel to the source region stripe;

gate dielectric segments over the source region stripe and extending toward the drain region stripe in a direction perpendicular to the source region stripe;

field dielectric segments alternating with the gate dielectric segments along a channel width direction in between and parallel to the source region stripe and the drain region stripe, each of the field dielectric segments having a greater dielectric thickness than each of the gate dielectric segments;

a conductive gate layer over the gate dielectric segments and the field dielectric segments; and a body region laterally surrounding the source region stripe, wherein the gate dielectric segments extend above and across the source region stripe and the body region.

16. The transistor device of claim 15, wherein:

each of the gate dielectric segments has a first segment width oriented parallel to the source region stripe;

each of the field dielectric segments has a second segment width oriented parallel to the source region stripe; and the first segment width is substantially equal to the second segment width.

17. The transistor device of claim 15, further comprising:

a gate dielectric stripe overlapping the source region stripe and connecting the gate dielectric segments to form a comb shape gate dielectric region; and a field dielectric stripe abutting the gate dielectric segments and connecting the field dielectric segments to form a comb shape field dielectric region interleaving the comb shape gate dielectric region.

* * * * *